United States Patent [19]
Chai et al.

[11] Patent Number: 5,839,460
[45] Date of Patent: Nov. 24, 1998

[54] APPARATUS FOR CLEANING SEMICONDUCTOR WAFERS

[75] Inventors: Jing Chai; Jackie Watson, both of St. Charles, Mo.

[73] Assignee: MEMC Electronic Materials, Inc., St. Peters, Mo.

[21] Appl. No.: 970,129

[22] Filed: Nov. 13, 1997

[51] Int. Cl.$^6$ ..................................................... B08B 3/04
[52] U.S. Cl. .......................... 134/147; 134/161; 134/902; 211/1.52; 211/41.18
[58] Field of Search .................................... 134/147, 161, 134/902, 153; 211/1.52, 1.53, 41.18

[56] References Cited

U.S. PATENT DOCUMENTS

| 3,679,517 | 7/1972 | Schulten et al. | 134/902 |
|---|---|---|---|
| 3,964,957 | 6/1976 | Walsh | 134/902 |
| 4,325,394 | 4/1982 | Reams | 134/902 |
| 5,539,505 | 7/1996 | Erk et al. | 134/902 |
| 5,626,159 | 5/1997 | Erk et al. | 134/902 |
| 5,672,212 | 9/1997 | Manos | 134/902 |
| 5,727,582 | 3/1998 | Terui | 134/902 |

FOREIGN PATENT DOCUMENTS

| 53-144265 | 12/1978 | Japan | 134/902 |
|---|---|---|---|
| 61-97836 | 5/1986 | Japan | 134/902 |
| 1-187931 | 7/1989 | Japan | 134/902 |
| 1-304733 | 12/1989 | Japan | 134/902 |
| 3-231428 | 1/1991 | Japan | 134/902 |
| 3-62925 | 3/1991 | Japan | 134/902 |
| 3-116731 | 5/1991 | Japan | 134/902 |
| 3-153029 | 7/1991 | Japan | 134/902 |
| 4-37131 | 2/1992 | Japan | 134/902 |

OTHER PUBLICATIONS

IBM Techanical Bulletin vol. 8 No. 12, May 5 1996.

*Primary Examiner*—Frankie L. Stinson
*Attorney, Agent, or Firm*—Senniger, Powers, Leavitt & Roedel

[57] ABSTRACT

An apparatus for cleaning semiconductor wafers includes a tank for containing a liquid and receiving a wafer holder with at least a portion of the wafers immersed in the liquid in the tank. A sonic energy generator imparts sonic energy to the liquid. A wafer-moving mechanism in the tank reciprocates and rotates the semiconductor wafer so that at least a portion of the wafer repeatedly passes through an upper surface of the liquid. The wafer-moving mechanism comprises a camming mechanism rotatably received in the tank and a drive for rotating the camming mechanism about a fixed central longitudinal axis of the camming mechanism to reciprocate and rotate the wafer. The camming mechanism includes a cam body having opposing flats spaced apart on opposite sides of its longitudinal axis and opposing gripping surfaces extending between the flats. The cam body has a cross-section defining a major axis and a minor axis, with the major axis of the cam body cross-section being greater than the minor axis. The gripping surfaces have a circumferentially extending groove for receiving a peripheral edge of the semiconductor wafer therein. The groove is sized for gripping the edge of the wafer as the camming mechanism rotates thereby to inhibit slippage of the wafer relative to the camming mechanism and to maintain uniform rotation and reciprocation of the wafer.

23 Claims, 8 Drawing Sheets

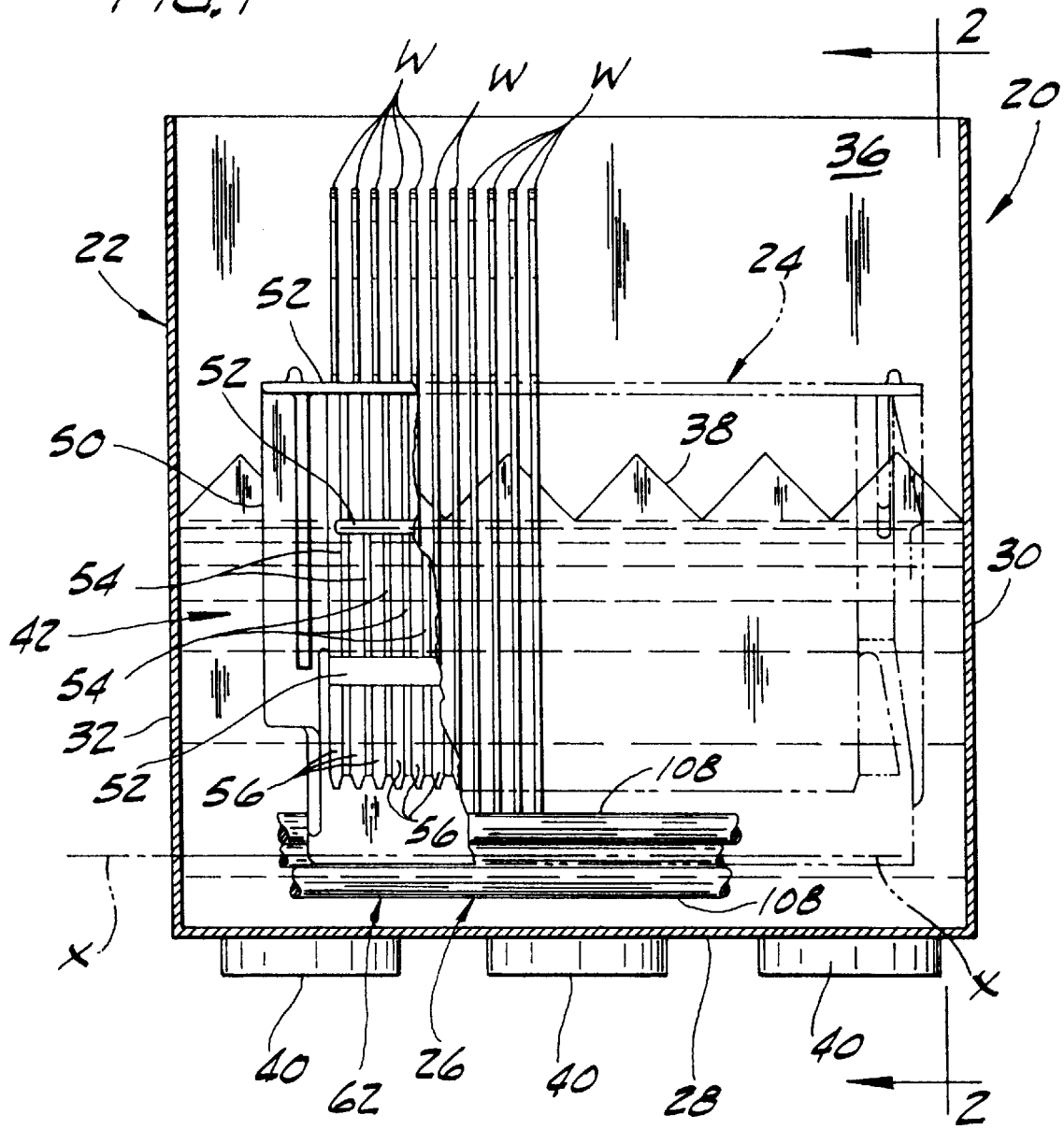

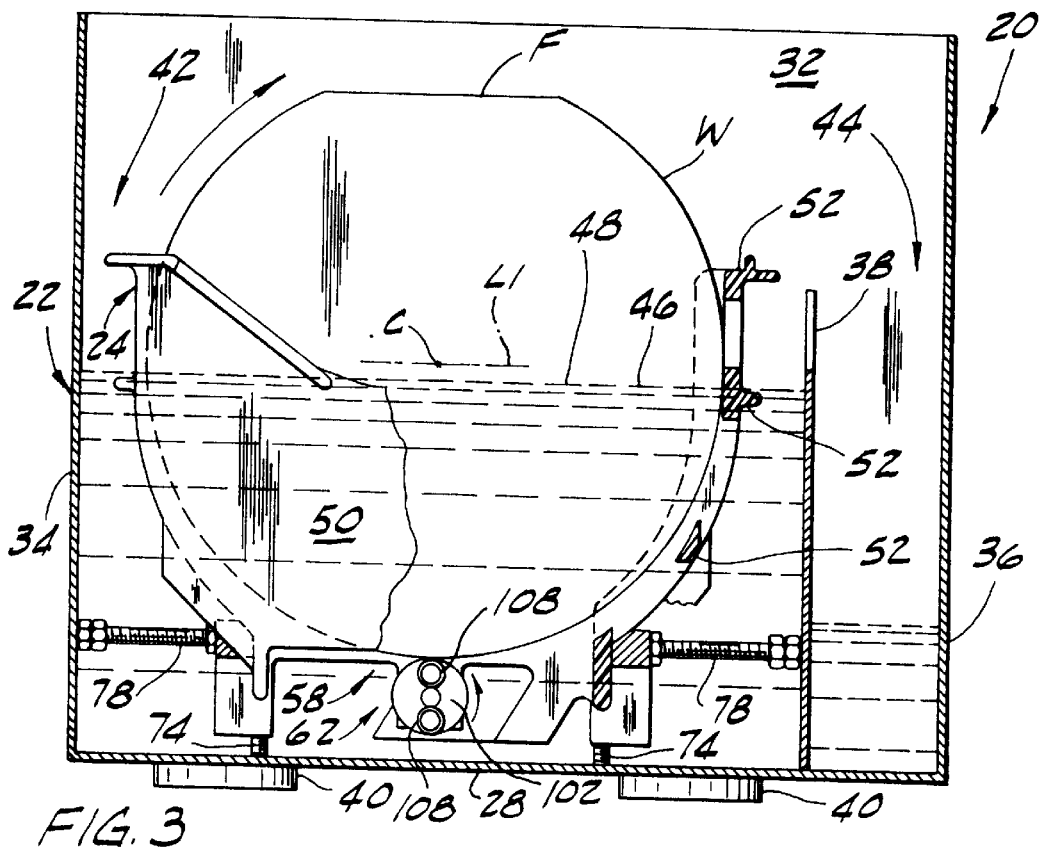
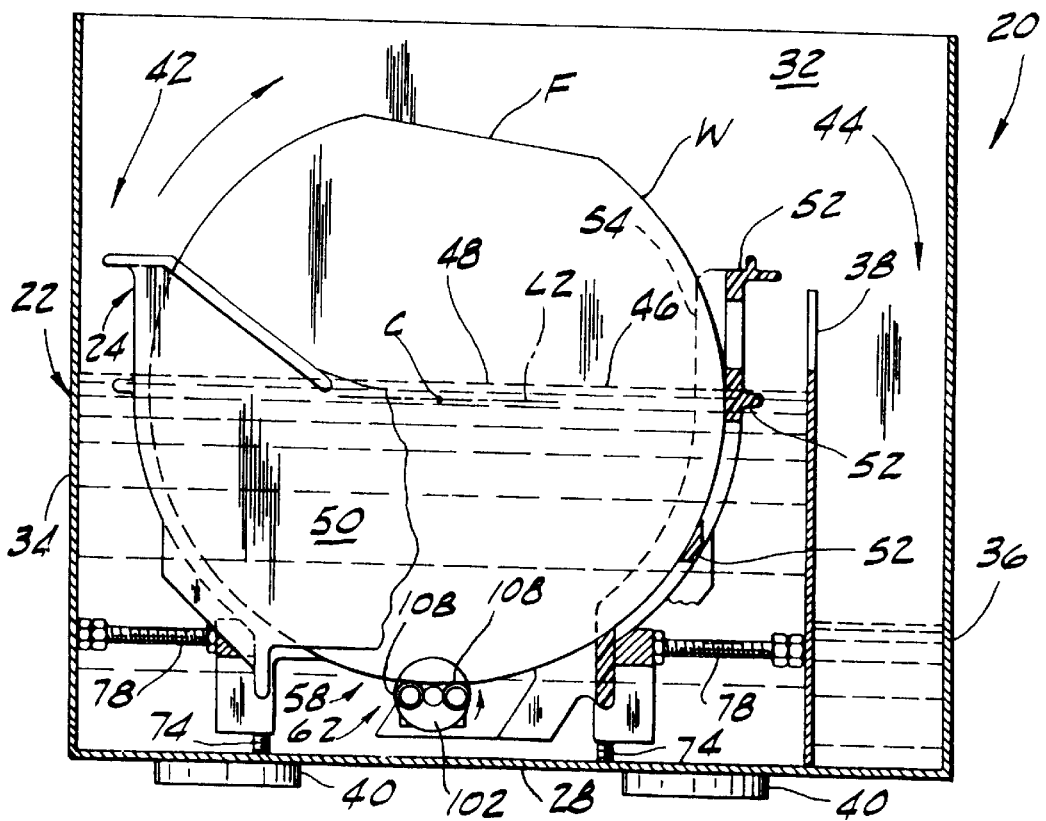

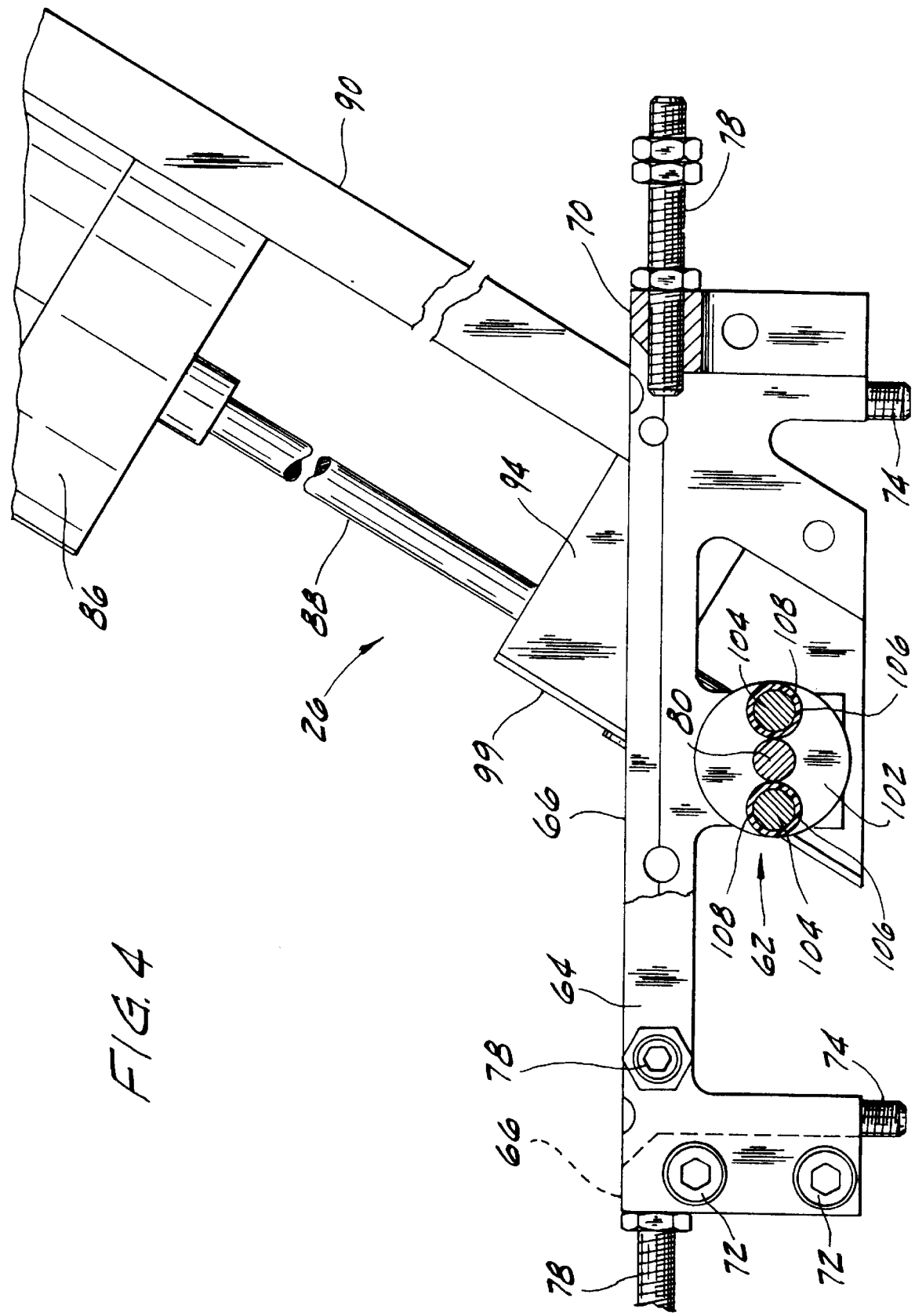

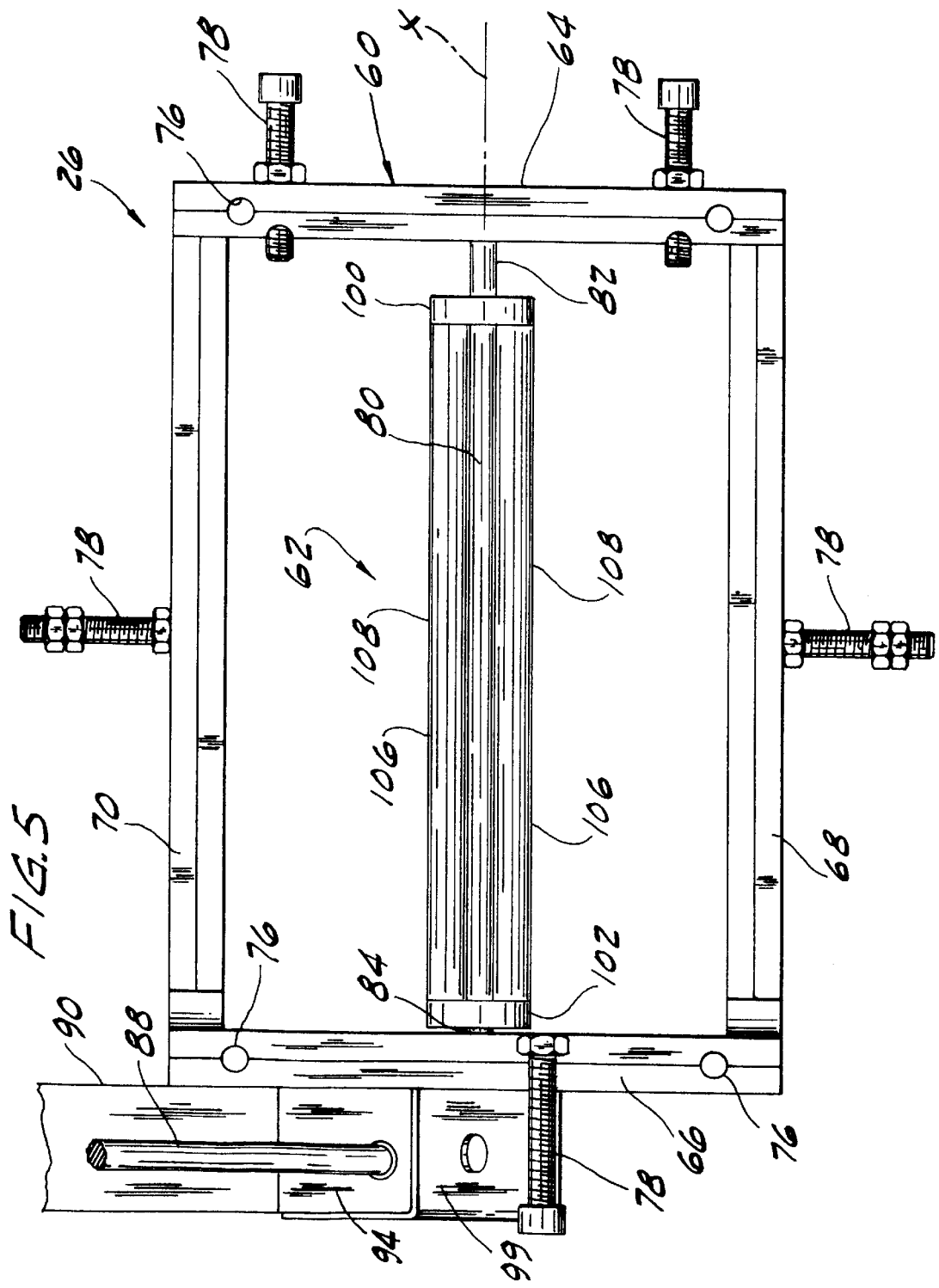

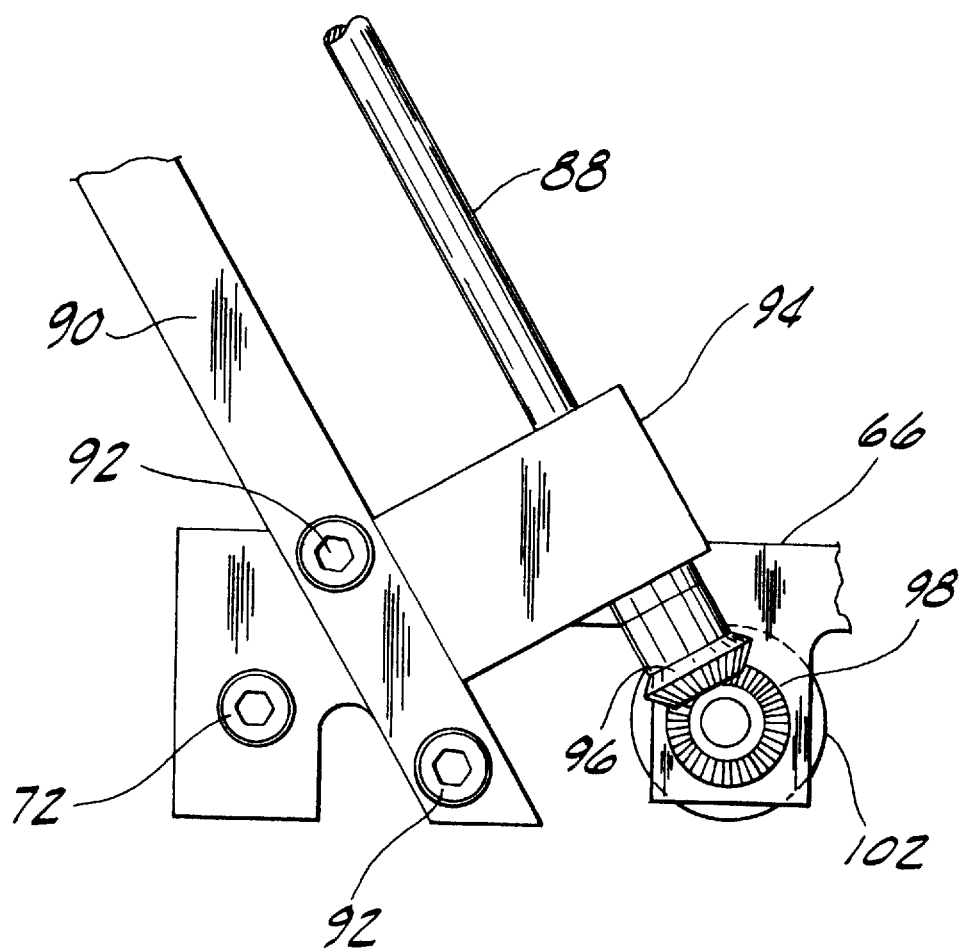

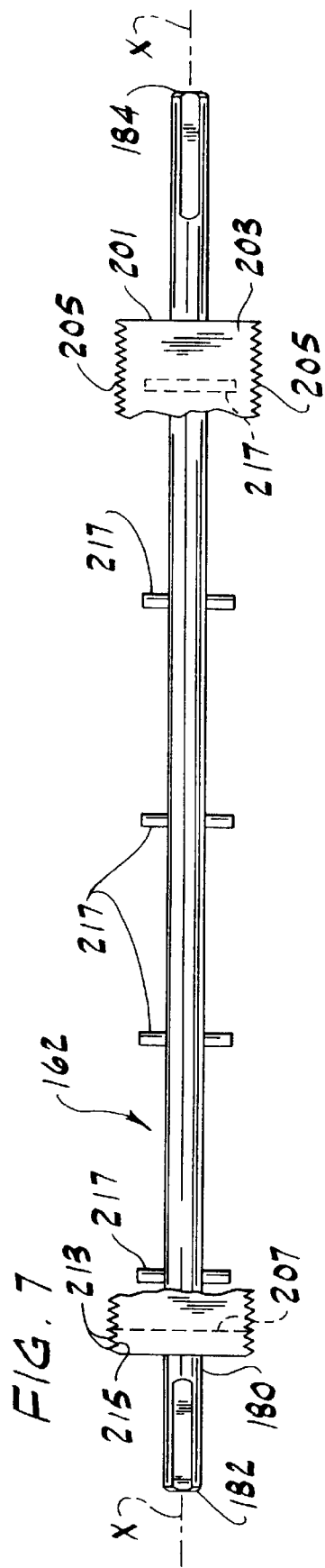
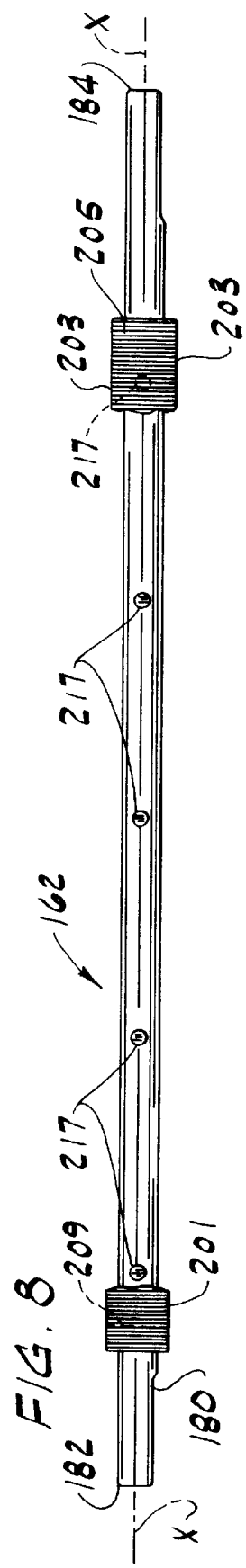
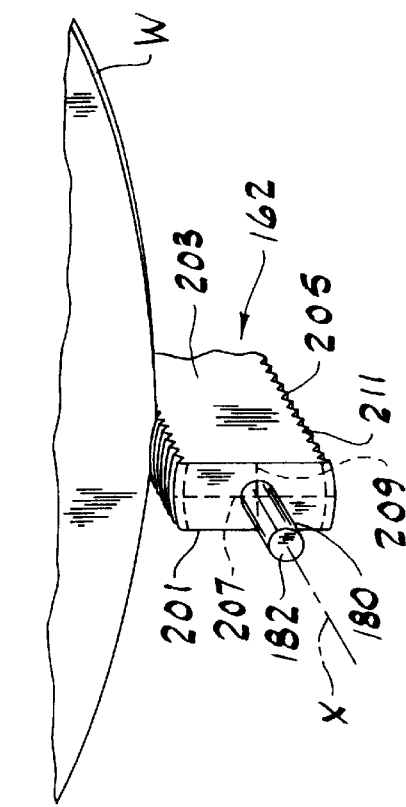
FIG. 7
FIG. 8
FIG. 9

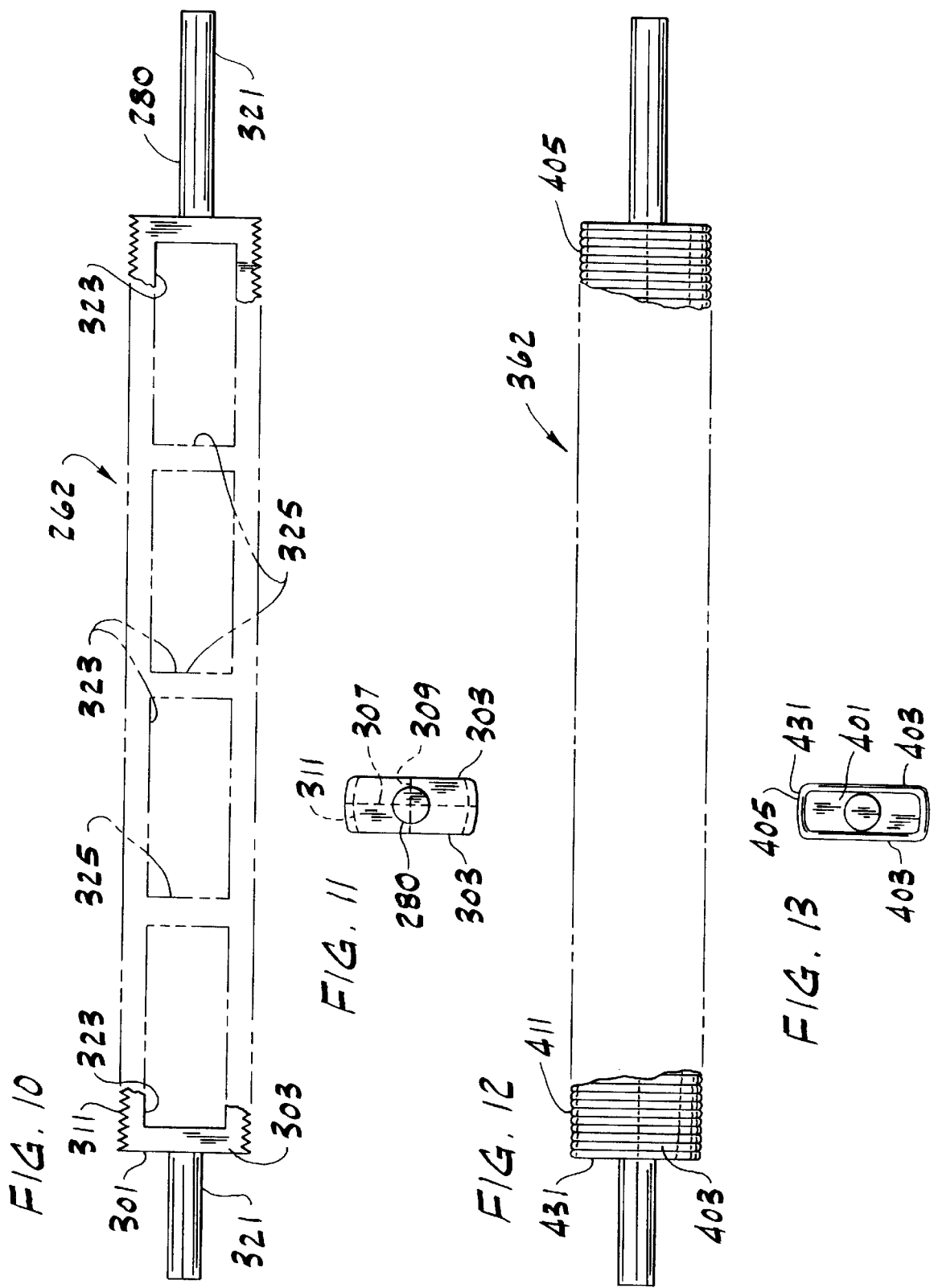

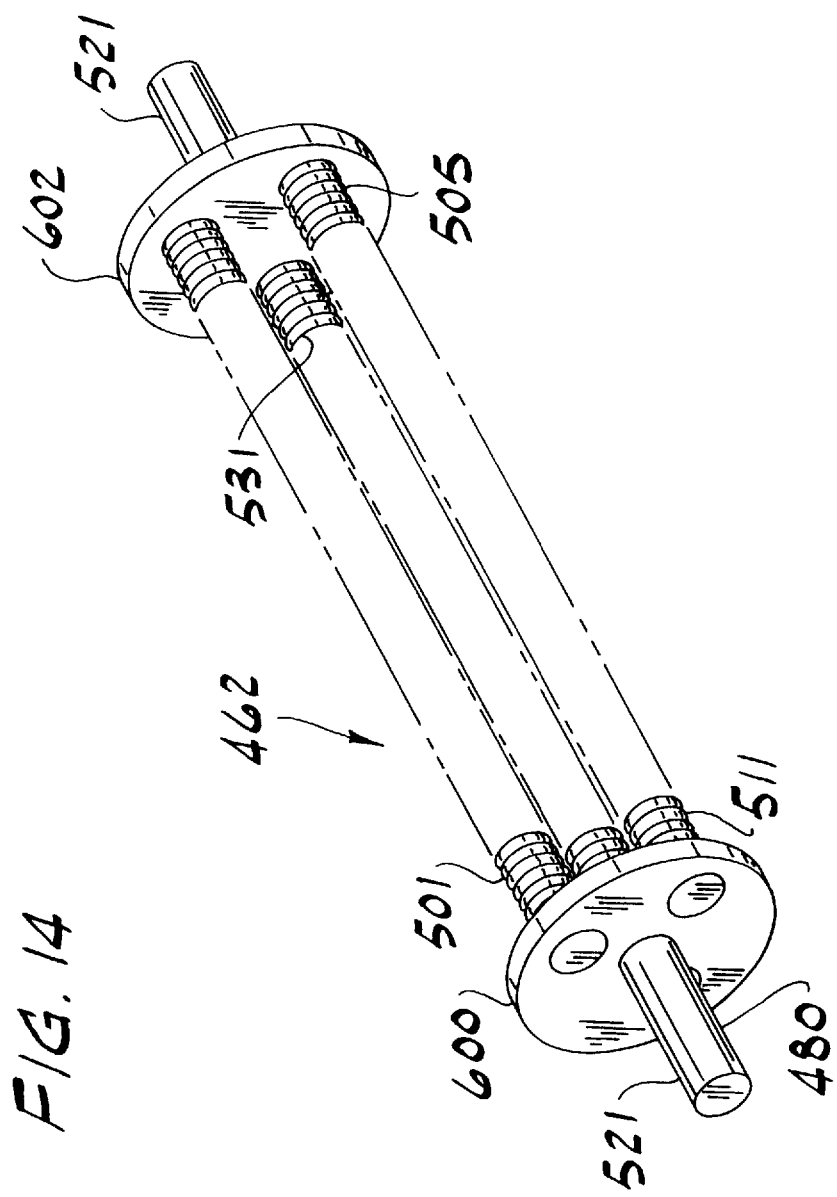

APPARATUS FOR CLEANING SEMICONDUCTOR WAFERS

BACKGROUND OF THE INVENTION

This invention relates to apparatus for cleaning semiconductor wafers, and more particularly to an apparatus for sonic cleaning of semiconductor wafers.

Semiconductor wafers for the microelectronics industry are produced by first slicing thin wafers from a crystal ingot. After slicing, the wafers undergo a lapping process to give them a somewhat uniform thickness. The wafers are then etched to remove damage and produce a smooth surface. The final step in a conventional semiconductor wafer shaping process is a polishing step to produce a highly reflective and damage-free surface on at least one face of the semiconductor wafer.

The wafers must be cleaned between the lapping and etching steps to remove contaminants such as silicon particles and abrasives. If the cleaning process is not effective, fine lapping grit will remain on the wafer surface. Such residual grit may cause contamination problems during electrical device fabrication.

Lapped silicon wafers are generally cleaned in ultrasonic tanks containing a caustic solution for wetting and dispersing contaminants. The total processing time to sufficiently clean wafers may be thirty minutes or more. Prolonged exposure to the ultrasonic vibration of the cleaning process may cause damage to the wafers. In addition, the severity of the damage increases as the exposure time increases.

Further, a lengthy cleaning process delays feedback to the lapping operator regarding the quality of the lapped wafers. If the wafers are not properly lapped, the operator needs wafer quality feedback before he can adjust the lapping process to avoid damaging additional wafers. This information is only available after the wafers are fully cleaned. The longer the cleaning process, the greater the number of potentially damaged wafers produced before the operator can correct the process.

One prior art apparatus for cleaning semiconductor wafers is disclosed in co-assigned U.S. Pat. No. 5,593,505, which is incorporated herein by reference. This apparatus comprises a tank containing a liquid, means for directing sonic energy through the liquid contained in the tank, a wafer holder, and a wafer-moving mechanism. The wafer holder holds the semiconductor wafer in a generally upright position within the tank with a central region of the semiconductor wafer being about level with the surface of the liquid contained in the tank. The wafer-moving mechanism is constructed of cylindrical rollers that engage the semiconductor wafer in the wafer holder to impart a rotating motion to the semiconductor wafer in the tank and to impart a generally up and down reciprocating motion to the semiconductor wafer so that the central region of the wafer repeatedly passes through the surface of the liquid.

This apparatus performs adequately with wafers produced by current production processes, including wafers that have discontinuities, such as an orientation flat or notch along the periphery of the wafer. However, there have been recent developments in wafer edge grinding which produce extremely smooth peripheral edges. When wafers subjected to fine edge grinding are rotated and agitated in this prior art apparatus, the edges of the wafers tend to slip against the wafer-moving mechanism. If a wafer has one or more flats, it may stop rotating when the center of the flat rests against the wafer-moving mechanism because there is not enough friction between the wafer and the wafer-moving mechanism to lift and rotate the wafer off its flat. Thus, the wafer-moving mechanism becomes an effective "flat finder", resulting in overexposure of the half of the wafer extending above the surface of the liquid and causing non-uniform cleaning and staining of the wafer.

If the wafer is notched rather than flatted, rotation of the wafer is more erratic and the speed of rotation is lower than for notched wafers produced by standard edge grinding. The erratic rotation and lower rotation speed adversely effects cleaning performance because the wafer is not cycled through the surface of the liquid in the tank as frequently as wafers rotating at a faster speed.

Also, the rollers used in the prior art wafer-moving mechanism are constructed of Tygon tubing, which, due to shrinkage and wear, must be replaced every two or three weeks, thereby increasing the down time and maintenance cost associated with the prior art apparatus. In addition, if the Tygon tubing is not replaced soon enough, the tubing may be worn through, increasing the risk that the wafers may contact the steel shaft around which the tubing is fitted, resulting in damage to the wafers in the form of edge chipping or staining.

SUMMARY OF THE INVENTION

Among the several objects and features of the present invention may be the provision of an improved apparatus for sonic cleaning of semiconductor wafers; the provision of such apparatus which continuously and smoothly rotates and reciprocates wafers with notched, flatted, and/or smooth edges; the provision of such apparatus which uniformly cleans the wafers by eliminating staining of the wafers caused by poor rotation and/or reciprocation; the provision of such apparatus which decreases the amount of machine downtime; the provision of such apparatus which reduces the risk of damage to the wafers due to wearing of the apparatus.

Generally, apparatus of the present invention for sonic cleaning of semiconductor wafers comprises a tank for containing a liquid. The tank is sized and shaped for receiving at least a portion of a semiconductor wafer. A sonic energy generator imparts sonic energy to the liquid and a wafer holder is received within the tank for holding the semiconductor wafer with at least a portion of the semiconductor wafer immersed in the liquid in the tank. A wafer-moving mechanism is received within the tank for reciprocating and rotating the semiconductor wafer so that at least a portion of the wafer repeatedly passes through an upper surface of the liquid. The wafer-moving mechanism comprises a camming mechanism rotatably received in the tank and a drive for rotating the camming mechanism about a fixed central longitudinal axis of the camming mechanism to reciprocate and rotate the wafer. The camming mechanism includes a cam body having opposing flats spaced apart on opposite sides of its longitudinal axis and opposing gripping surfaces extending between the flats. The cam body has a cross-section defining a major axis and a minor axis, with the major axis of the cam body cross-section being greater than the minor axis. The gripping surfaces have a circumferentially extending groove for receiving a peripheral edge of the semiconductor wafer therein. The groove is sized for gripping the edge of the wafer as the camming mechanism rotates thereby to inhibit slippage of the wafer relative to the camming mechanism and to maintain uniform rotation and reciprocation of the wafer.

Other objects and features of the present invention will be in part apparent and in part pointed out hereinafter.

BRIEF DESCRIPTION OF THE DRAWINGS

FIG. 1 is a schematic side elevational view of a prior art wafer cleaning apparatus with portions broken away to show detail;

FIG. 2 is a sectional view taken along the plane of line 2—2 of FIG. 1 with portions broken away to show detail;

FIG. 3 is a sectional view similar to the view of FIG. 2 but showing a semiconductor wafer rotated clockwise a few degrees and in a lowered position;

FIG. 4 is an enlarged front elevational view of a wafer moving mechanism of the prior art apparatus;

FIG. 5 is a top plan view of the prior art wafer moving mechanism;

FIG. 6 is a partial rear elevational view of the prior art wafer moving mechanism;

FIG. 7 is a side elevation of a first embodiment of a camming mechanism of a wafer cleaning apparatus of the present invention with portions broken away to show detail;

FIG. 8 is a top plan view of the camming mechanism of FIG. 7 with portions broken away to show detail;

FIG. 9 is a fragmentary perspective of the camming mechanism of FIG. 7 with a semiconductor wafer shown engaged in a groove of the camming mechanism;

FIG. 10 is a fragmentary side elevation of a second embodiment of a camming mechanism of a wafer cleaning apparatus of the present invention;

FIG. 11 is an end view of the camming mechanism of FIG. 10;

FIG. 12 is a fragmentary side elevation of a third embodiment of a camming mechanism of a wafer cleaning apparatus of the present invention;

FIG. 13 is an end view of the camming mechanism of FIG. 12; and

FIG. 14 is a fragmentary perspective of a fourth embodiment of a camming mechanism of a wafer cleaning apparatus of the present invention;

Corresponding reference characters indicate corresponding parts throughout the several views of the drawings.

DETAILED DESCRIPTION OF THE PREFERRED EMBODIMENTS

Referring now to the drawings, and more particularly to FIGS. 1–3, a prior art apparatus for sonic cleaning of semiconductor wafers is indicated in its entirety by the reference numeral 20. This apparatus is disclosed in co-assigned U.S. patent application Ser. No. 5,593,505, which is incorporated herein by reference. The wafer cleaning apparatus 20 comprises an ultrasonic tank, generally indicated at 22, a cassette, generally indicated at 24, for holding a plurality of semiconductor wafers W, and a wafer-moving mechanism, generally indicated at 26.

It is concluded in the prior art that cleaning of semiconductor wafers in an ultrasonic tank is most effective at the surface of the liquid in the tank, i.e., at the gas-liquid-interface. In other words, ultrasonic energy will clean a portion of a semiconductor wafer located at or just slightly below the gas-liquid-interface at a faster rate than it will clean a portion of the semiconductor wafer well below the gas-liquid-interface. The principal of operation of the wafer-cleaning apparatus 20 is based on this conclusion.

The tank 22 comprises a generally horizontal bottom 28, a front wall 30, a back wall 32, two side walls 34, 36 extending between the front and back walls, a weir 38 generally parallel to the front and back walls and extending between the side walls, and a plurality of ultrasonic or megasonic transducers 40 (shown schematically in FIGS. 1–3) attached to the underside of the bottom. The front wall 30, weir 38, side walls 34, 36, and bottom 28 define a bath, generally indicated at 42, for holding a suitable cleaning liquid. Preferably, the cleaning liquid is a solution of 2% by volume concentrated KOH (45 wt %) and 2% by volume of a commercially available detergent (e.g., Vector HTC, available from Intersurface Dynamics of Bethel, Conn.). A 2–5 wt % citric acid may be used instead of the KOH without departing from the scope of this invention. Also preferably, the bath temperature is about 60° C. during cleaning of the wafers. The megasonic transducers 40 constitute means for directing sonic energy through liquid contained in the bath 42. The weir 38, back wall 32, side walls 34, 36, and bottom 28 define an overflow receptacle, generally indicated at 44 in FIGS. 2 and 3. The liquid is preferably introduced into the bath 42 via an inlet port (not shown) in the bottom 28 of the tank 22, fills the bath 42, and flows over the weir 38 into the overflow receptacle 44. As long as liquid is being introduced into the bath 42, the weir maintains the liquid in the bath at a constant level. In other words, the gas-liquid-interface, indicated at 46, is maintained at a constant level 48. The overflow receptacle 44 has a drain (not shown) for draining liquid therefrom. The tank 22 is preferably a conventional ultrasonic tank, such as a SWEEPSONIK 2 model 40-SWP2-1819N ultrasonic tank commercially available from Ney Ultrasonics of Bloomfield, Conn., but with the weir lowered to lower the liquid level in the bath. Preferably, the ultrasonic tank 22 further includes a circulatory system (not shown) for filtering and recirculating the drained liquid back into the bath 42.

The cassette 24 constitutes a wafer holder for holding the semiconductor wafers W generally upright within the bath 22. Preferably, the cassette 24 is a conventional cassette, such as a model X4200-01 cassette, commercially available from Empak of Colorado Springs, Colo. The cassette 24 has end walls 50, a plurality of horizontal stringers 52 extending between the end walls, and a plurality of upright ribs 54 connected to and spaced at generally equal intervals along the stringers. The spaced upright ribs 54 define wafer receiving slots 56 (FIG. 1). The stringers 52 are adapted to engage the periphery of the semiconductor wafers W to limit lateral movement of the wafers (i.e., left and right movement of the wafers as viewed in FIGS. 2 and 3) when the wafers are received in the wafer receiving slots 56. The ribs 54 are adapted to engage the edge margins of faces of the semiconductor wafers W to limit longitudinal motion of the wafers (i.e., left and right movement of the wafers as viewed in FIG. 1). The cassette 24 preferably has an open bottom 58 (FIGS. 2 and 3) through which the wafers may contact the wafer-moving mechanism 26.

Referring now to FIGS. 4–6, the prior art wafer-moving mechanism 26 has a generally rectangular cassette receiving platform, generally indicated at 60, and a camming mechanism, generally indicated at 62. The cassette receiving platform 60 is preferably of stainless steel and comprises an elongate front member 64, an elongate rear member 66, and two elongate side members 68, 70. The front and rear members 64, 66 are secured to ends of the side members 68, 70 by suitable screws 72 (only two of which are shown in FIG. 4). Preferably, upper edges of the members 64, 66, 68, 70 are beveled to receive the cassette 24. Feet 74 extend downwardly from the front and rear members 64, 66 to engage the bottom 28 of the tank 22 and thereby elevate and level the platform 60 above the bottom. Preferably, the feet 74 comprise screws threaded in vertical holes 76 (FIG. 5) through the front and rear members 64, 66. Turning of the screws 74 in the holes 76 adjusts the elevation of the cassette receiving platform 60 in the bath 42. Horizontally extending screws 78, threaded through the members 64, 66, 68, 70 of the cassette receiving platform 60, extend outward from the platform and press against the inner surfaces of the walls of the bath 42 to secure the wafer-moving mechanism 26 to the tank 22.

The camming mechanism 62 includes a driven shaft 80 extending along a generally horizontal axis X (FIGS. 1 and 5) between the front and rear members 64, 66 of the cassette receiving platform 60. A forward end 82 of the driven shaft 80 is journaled via a suitable bushing (not shown) in the front member 64. A rear end 84 of the driven shaft 80 extends through the rear member 66 and is journaled therein via a suitable bushing (not shown). Preferably, the driven shaft 80 is rotated by a suitable motor 86 (FIG. 4) having a shaft 88 which is generally perpendicular to the axis of the driven shaft. The motor 86 is secured to an elongate motor support 90 extending generally upward from and secured via screws 92 (FIG. 6) to the rear member 66 of the cassette receiving platform 60. Preferably, the motor shaft 88 and motor support 90 extend upward beyond the level of liquid in the bath 42 to keep the motor above the liquid. The lower end of the motor shaft 88 is journaled in and supported by a suitable bearing block 94. A drive bevel gear 96 (FIG. 6) keyed to a lower end of the motor shaft 88 meshes with a driven bevel gear 98 keyed to the rear end 84 of the driven shaft 80. Preferably, a suitable cover 99 (shown in FIG. 5, but removed in FIG. 6) is secured to the bearing block 94 and covers the gears 96, 98. Rotation of the motor shaft 88 rotates the driven shaft 80 about the axis X.

The prior art camming mechanism 62 further includes forward and rear disc-shaped blocks 100, 102, respectively. The forward disc-shaped block 100 is keyed to the driven shaft 80 generally adjacent the front member 64 of the cassette receiving platform 60. The rear disc-shaped block 102 is keyed to the driven shaft 80 generally adjacent the rear member 66 of the cassette receiving platform 60. Two elongate rods 104 (FIG. 4) extend between the disc-shaped blocks 100, 102 generally parallel to the driven shaft 80. The ends of the rods 104 extend into holes (not shown) in the disc-shaped blocks. Preferably, tubes 106 of a suitable elastomeric material (e.g., Tygon®) surround the rods 104 and extend from the forward disc-shaped block 100 to the rear disc-shaped block 102. As described in greater detail below, the outer surfaces of the tubes 106 constitute camming surfaces 108 engageable with the periphery of each semiconductor wafers W. As shown in FIG. 4, the rods 104 are preferably positioned closely adjacent the driven shaft 80 so that the tubes 106 frictionally engage the shaft to prevent rotation of the tubes relative to the shaft. Thus, the disc-shaped blocks 100 and 102, rods 104, and tubes 106 rotate with the driven shaft 80. The tubes 106 are preferably sized and arranged such that when the edge of the wafer is in contact with the camming surface, the wafer edge does not touch the driven shaft 80 at any rotational position of the camming mechanism.

Referring to FIGS. 1–3, when the cassette 24 (with semiconductor wafers W held therein) is inserted in the bath 42 and placed on the cassette receiving platform 60, then bottom portions of the peripheries of the semiconductor wafers contact the camming surfaces 108 (i.e., the outer surfaces of the tubes 106). Since the camming surfaces 108 rotate with the driven shaft 80, rotation of the camming mechanism 62 causes the camming surfaces to revolve around (i.e., orbit) the axis X. The orbiting of the camming surfaces 108 causes the wafers W to reciprocate up and down between a raised position (shown in FIG. 2) and a lowered position (shown in FIG. 3). The camming surfaces 108 also frictionally engage the peripheries of the semiconductor wafers W to cause the wafers to roll on the camming surfaces and thereby counter-rotate relative to the rotation of the driven shaft 80. In other words, counter-clockwise rotation of the camming mechanism 62 (as viewed in FIGS. 2 and 3) and its associated camming surfaces 108 causes clockwise rotation of the semiconductor wafers. Thus, the orbiting of the camming surfaces 108 about the axis X simultaneously imparts an up and down reciprocating motion to and rotates the wafers W.

As discussed above, the weir 38 determines the level 48 of the gas-liquid-interface 46 in the bath 42. The cassette receiving platform 60 is vertically positioned within the bath 42 relative to the weir 38 such that centers C (FIGS. 2 and 3) of the semiconductor wafers W are at an upper level $L_1$ (FIG. 2) above the gas-liquid-interface 46 when the wafers are in their raised position and at a lower level $L_2$ (FIG. 3) below the gas-liquid-interface 46 when the wafers are in their lowered position. Preferably, the weir 38 and level of the platform 60 are selected so that the level 48 of the gas-liquid-interface 46 is generally midway between the upper level $L_1$ and the lower level $L_2$. Thus, the centers C of the semiconductor wafers W pass through the gas-liquid-interface 46 each time the wafers are raised or lowered.

In operation of the apparatus 20, semiconductor wafers W to be cleaned are placed upright in the cassette 24 within the wafer receiving slots 56. The cassette 24 and wafers W are then picked up (either manually or via a robot arm (not shown)) and placed in the bath 42 on the cassette receiving platform 60. With the cassette 24 positioned on the cassette receiving platform 60, at least one of the two camming surfaces 108 engages the edge of each semiconductor wafer W. Operation of the motor 86 rotates the camming mechanism 62 about the axis X to simultaneously reciprocate and rotate the semiconductor wafers W. The reciprocation action causes the center C of each semiconductor wafer W to move up and down between the upper level $L_1$ (FIG. 2) and the lower level $L_2$ (FIG. 3). The level 48 of cleaning liquid in the bath 42 is selected to be generally midway between the upper and lower levels $L_1$, $L_2$ when the cassette 24 is positioned on the cassette receiving platform 60 and the semiconductor wafers W are being reciprocated and rotated by the camming mechanism 62.

As the position of each semiconductor wafer W is varied (i.e., as the semiconductor wafer is reciprocated and rotated), sonic frequency is directed through the cleaning liquid by the transducers 40 to sonically clean the wafers. Preferably, the transducers 40 emit sonic frequency in the range of about 38 to 42 Khz, 72 Khz, 80 Khz or 104 Khz. As explained above, cleaning of the semiconductor wafers W in the sonic bath 42 is most effective at or near the gas-liquid-interface 46. The position of each semiconductor wafer W relative to the constant level 48 of the gas-liquid-interface 46 and the simultaneous reciprocating and rotational motion of the wafer ensure that every portion of the wafer passes through the gas-liquid-interface during each complete rotation of the semiconductor wafer (i.e., as the wafer is rotated 360 degrees). Since the entire surface of the semiconductor wafer W passes through the gas-liquid-interface during each complete rotation of the wafer, every portion of the wafer is subjected to the most effective cleaning action for at least a fraction of the duration of such complete rotation. Preferably, rotation of the camming mechanism 62 rotates the semiconductor wafers W at a rate of at least approximately 8 rpm, and more preferably at a rate between approximately 12 and 18 rpm. The rotational rate of the semiconductor wafers W depends on the rotational speed of the driven axis 82, the outer diameter of the tubes 106, the distance between the axis X and the center of each rod 104, and the diameter of the semiconductor wafers. Because the camming mechanism 62 has two camming surfaces 108, each complete rotation of the camming mechanism results in two complete reciprocation cycles of the semiconductor wafers (i.e., the semiconductor wafers are moved up and down two times for every complete rotation of the camming mechanism). Preferably, the semiconductor wafers W are reciprocated up and down at a rate of at least approximately 20 cycles per minute, more preferably at a rate of at least 60 cycles per minute, and most preferably, at a rate of about 140 to 240 cycles per minute (i.e., twice the rotational speed of the camming mechanism). Subjected to these cleaning conditions, the semiconductor wafers are sufficiently cleaned in five to ten minutes. The rapid cleaning of the semiconductor wafers minimizes the exposure time to the ultrasonic energy and, therefore, minimizes ultrasonic damage to the wafers. The rapid cleaning also allows feedback information to be rapidly provided to the lapping operator so that any needed corrective adjustments to the lapping process can be timely made.

After the semiconductor wafers W are cleaned, the cassette 24 is lifted (either manually or via a robot arm) off the cassette receiving platform 60 and removed from the bath 42. Preferably, the cassette 24 is not fastened to the tank 22 or to the wafer moving mechanism 26 and no disconnection is necessary before removal of the cassette and semiconductor wafers W. Since the cassette 24 is not fastened to the tank or wafer moving mechanism, the cassette and wafers may be quickly and easily inserted in and removed from the bath. The weight of the cassette 24 is sufficient to keep the cassette stationary on the cassette receiving platform 60 as the semiconductor wafers W are reciprocated and rotated by the camming mechanism 62. Also, the camming mechanism 62 does not engage nor move the cassette 24. Thus, the semiconductor wafers W are reciprocated up and down and rotated independent of the cassette 24. Preferably, the reciprocation is sufficient to move the periphery of each semiconductor wafer W away from lower portions of the ribs 54 and the lower stringers 52 (FIG. 2) of the cassette 24 as the wafer is moved to its upper most position. Moving the wafer's periphery away from the ribs 54 and stringers 52 ensures that the ribs and stringers do not cause dead spots in the wafers (i.e., regions which are masked by the ribs and, therefore, not sufficiently cleaned).

With reference to FIGS. 7–9, apparatus of the present invention for sonic cleaning of the semiconductor wafers is substantially similar to the prior art wafer cleaning apparatus 20 described above with the exception of the camming mechanism 62 of the wafer-moving mechanism 26. FIG. 7 illustrates a first embodiment of a camming mechanism, generally indicated at 162 of the apparatus of the present invention comprising a driven shaft 180 which extends generally horizontally between the front and rear members 64, 66 of the cassette receiving platform 60, and an elongate cam body 201 mounted on the shaft 180 for conjoint rotation with the shaft about the longitudinal axis X of the camming mechanism.

The cam body 201 is generally rectangular, having a pair of opposing flats 203 and opposing, generally arcuate gripping surfaces 205 extending between the flats. A central longitudinal axis of the cam body is coincident with the longitudinal axis X of the camming mechanism 162. The cross-section of the cam body 201 defines a major axis 207 and a minor axis 209, each extending transversely to the driven shaft 180 and intersecting at the longitudinal axis X of the camming mechanism 162. In the illustrated embodiment, the major axis 207 of the cam body 201 extends between the gripping surfaces 205 and the minor axis 209 extends between the flats 203 (i.e., the gripping surfaces are spaced apart a greater distance than the flats). As an example, the length of the major axis 207 is about 1.0 inch and the length of the minor axis 209 is about 0.5 inches.

The cam body 201 is preferably constructed of an elastomeric material, such as polyurethane, to facilitate frictional engagement between the cam body and the semiconductor wafers W in the cassette 24. The elastomeric material preferably has a Shore A durometer hardness of less than or equal to about 75 and more preferably has a Shore A durometer hardness of about 50. It is also contemplated that materials other than polyurethane may be used, such as the material sold by 3M Co. under the trademark KEL-F or other suitable materials, without departing from the scope of the invention.

As illustrated in FIG. 7, the flats 203 of the cam body 201 are generally smooth. The gripping surfaces 205 of the cam body 201 have circumferentially extending grooves 211 closely spaced apart thereon along the length of the body. The grooves 211 are generally V-shaped, each having a widened outer end 213 sized for receiving the peripheral edge of a wafer W as the camming mechanism 162 rotates about its longitudinal axis X. The grooves 211 each narrow toward an inner end 215, having a width substantially narrower than the thickness of each wafer W to grip the edge of the wafer within the groove to hold the wafer in the groove. As an example, the cam body 201 of the illustrated embodiment is sized for receiving a semiconductor wafer W having a thickness of about 0.7 mm, so that the widened outer end 213 of the groove 211 must be greater than 0.7 mm wide for receiving the wafer into the groove and the groove must narrow to a width less than 0.7 mm for holding the wafer in the groove. The depth of the groove 211 is approximately 1 mm. However, it is to be understood that the groove 211 may be other than V-shaped and may vary in size, depending on the thickness of the semiconductor wafer W, without departing from the scope of this invention.

The driven shaft 180 is constructed of stainless steel and is substantially longer than the cam body 201 so that a forward end 182 and a rear end 184 of the shaft project outward from the ends of the cam body. The shaft 180 also has stainless steel support pins 217 connected thereto and extending within the cam body 201 transverse to the longitudinal axis X of the camming mechanism 162. The support pins 217 are spaced apart in generally parallel relationship with the major axis 207 of the cam body 201 to provide support to the elastomeric material of the cam body. As an example, the driven shaft 180 of the illustrated embodiment of FIG. 7 is ¼ inches in diameter and the support pins 217 of the shaft are approximately ¹⁄₁₆ inches in diameter and ⅝ inches in length. However, these dimensions may vary, depending on the desired rigidity or strength of the camming mechanism 162 and the size of the cam body 201, without departing from the scope of the invention.

In a preferred method of constructing the camming mechanism 162, the steel support pins 217 are compressed through openings (not shown) in the steel shaft 180 and the elastomeric cam body 201 is then molded onto the shaft as a generally cylindrical body having a diameter substantially equal to the desired length of the major axis 207 of the cam body (e.g., 1.0 inch). The grooves 211 are circumferentially ground into the cam body 201 and a sufficient amount of elastomeric material is removed from the cam body to define the flats 203 and give the cam body the desired dimensions. It is contemplated that where the steel material of the shaft 180 is incompatible with the chemical in the liquid bath, the cam body 211 and driven shaft may be integrally formed or molded from an elastomeric material to define a single-piece elastomeric camming mechanism without departing from the scope of this invention.

As in the prior art, the forward end 182 of the driven shaft 180 is journaled via a suitable bushing (not shown) in the front member 64 of the cassette receiving platform 60. The rear end 184 of the driven shaft 180 extends through the rear member 66 of the platform 60 and is journaled therein via a suitable bushing (not shown). The driven shaft 180 is rotated by the motor 86 (FIG. 4) so that the shaft and cam body 201 rotate conjointly about the axis X of the camming mechanism 162. Since the major axis 207 of the cam body 201 is substantially greater than the minor axis 209, rotation of the driven shaft and cam body causes the wafers W to reciprocate up and down between a raised position (not shown but similar to the raised position shown in FIG. 2) and a lowered position (not shown but similar to the lowered position shown in FIG. 3).

When the wafers W contact the gripping surfaces 205, the peripheral edges of the wafers are received by and held in the grooves 211 in frictional engagement with the gripping surfaces, causing the wafers to roll on the cam body 201 in a counter-rotating direction with respect to the rotating driven shaft 180 and cam body. In other words, counter-clockwise rotation of the camming mechanism 162 causes clockwise rotation of the semiconductor wafers W. Thus, the rotating camming mechanism 162 imparts both an up and down reciprocating and rotating motion on the wafers W. The rotational rate of the semiconductor wafers W depends on the rotational speed of the driven shaft 180, the length of the major and minor axes 207, 209 of the cross-section of the cam body 201, and the diameter of the semiconductor wafers. Since the camming mechanism 162 has a pair of flats 203 and a pair of gripping surfaces 205, each complete rotation of the camming mechanism results in two complete reciprocation cycles of the semiconductor wafers W (i.e., the semiconductor wafers are moved up and down two times for each complete rotation of the camming mechanism). Also, as in the prior art, the camming mechanism 162 does not engage nor move the cassette 24. Thus, the semiconductor wafers W are reciprocated up and down and rotated independently of the cassette 24.

Since the surface of the cam body 201 is not entirely arcuate, but rather has flats 203 extending between the arcuate gripping surfaces 205, the motion imparted to the semiconductor wafers W is somewhat bumpy as the camming mechanism 162 is rotated. This, as well as the generally smooth surface defined by the flats 203, may result in some slipping between the cam body 201 and the wafers W. This slipping causes the rotational motion to be somewhat nonuniform which prevents marks that might otherwise occur if the motion would have a fixed pattern. However, the frictional engagement between the wafers W and the cam body 201 in the grooves 211 of the gripping surfaces 205 reduce the risk that orientation flats F of the semiconductor wafers W will hinder rotation.

FIG. 10 illustrates a second embodiment of a wafer cleaning apparatus of the present invention in which the cam body 301 and driven shaft 280 of the camming mechanism 262 are both formed from elastomeric material, such as polyurethane, or a material sold by 3M Co. under the trademark KEL-F, or other suitable material. The cam body 301 is preferably formed from an elongate, molded cylinder having a diameter substantially equivalent to the desired length of the major axis 307. The grooves 311 are cut circumferentially into the cylinder and a sufficient amount of elastomeric material is removed from the cam body 301 to define the flats 303 and give the cam body the desired dimensions. The driven shaft 280 is defined by projections 321 extending longitudinally outward from the ends of the cam body 301. These projections 321 are preferably integrally formed or molded with the cam body 301, but may be constructed independently and attached to the cam body by adhesive or other suitable bonding methods and remain within the scope of this invention.

Generally rectangular openings 323 extend through the cam body 301 in parallel relationship with the minor axis 307 of the cam body (e.g., between the flats 303). The portions of the cam body 301 remaining between the openings 323 define cross-supports 325 for strengthening or rigidifying the cam body. Providing these openings 323 in the cam body reduces the mass of the camming mechanism 262. This mass reduction reduces the blocking of sonic energy travel through the liquid in the tank 22 by the camming mechanism 262, thereby increasing the sonic energy transmission within the bath. It is understood that a single, enlarged opening (not shown) may be provided instead of the set of smaller openings 323 shown in FIG. 10, thereby eliminating the cross-supports 325, without departing from the scope of this invention.

FIG. 12 illustrates a third embodiment of the wafer cleaning apparatus of the present invention in which the gripping surfaces 405 of the camming mechanism 362 are defined by O-rings 431 constructed of an elastomeric material. The O-rings 431 are placed around the cam body 401 (FIG. 13) in tight fitting relationship therewith so that the O-rings conform to the generally rectangular cross-sectional shape of the cam body and are held in place due to frictional engagement between the O-rings and the cam body. The O-rings 431 are arranged in side-by-side engagement spanning the length of the cam body 401, so that the grooves 411 of the gripping surfaces 405 are defined by adjacent O-rings. In this embodiment, the gripping surfaces 405 extend completely around the cam body such that the flats 403 are no longer smooth. In constructing the camming mechanism 362 of this third embodiment, the cam body 401 around which the O-rings 431 are placed may be that of either of the embodiments shown in FIGS. 7–9 and FIGS. 10–11 without departing from the scope of this invention.

FIG. 14 illustrates a fourth embodiment of the wafer cleaning apparatus of the present invention in which the cam body 501 of the camming mechanism 462 comprises elongate rods 604 extending lengthwise in space, parallel relationship with the central longitudinal axis X of the camming mechanism. The ends of the rods 604 are attached to respective forward and rearward disc-shaped blocks 600, 602 in a manner similar to the rods 104 and blocks 100, 102 of the prior art (FIGS. 4 and 5). The rods 604 may be constructed of stainless steel, a rigid plastic such as a material sold by 3M Co. under the trademark KEL-F, or other suitable material.

In the illustrated embodiment, three rods 604 are shown extending between the blocks 600, 602. The rods 604 are equally spaced radially outward from the central longitudinal axis X of the camming mechanism 462 for orbital rotation about this axis when the driven shaft 480 is driven by the motor 86. The rods 604 are attached to the blocks 600, 602 by suitable methods to prevent relative rotation of the rods with respect to the blocks. For proper operation of the invention, at least two rods 604 must be used, although it is understood that the number of rods may otherwise vary without departing from the scope of the invention.

The driven shaft 480 of this fourth embodiment is defined by projections 521 extending longitudinally outward from the disc-shaped blocks 600, 602 in coincident relationship with the central longitudinal axis X of the camming mechanism 462. These projections 521 are preferably integrally formed or molded with the blocks 600, 602, but may be constructed independently and attached to the blocks by suitable bonding or fastening methods and remain within the scope of this invention.

The gripping surfaces 505 of the camming mechanism 462 are defined by O-rings 531 constructed of an elastomeric material. The O-rings 531 are placed around each of the rods 604 of the cam body 501 in tight fitting relationship therewith so that they are held in place by frictional engagement between the O-rings and the rods. The O-rings 531 are arranged in side-by-side engagement spanning the length of each rod so that the grooves 511 of the gripping surfaces 505 are defined by adjacent O-rings.

In operation, when the motor 86 drives the driven shaft 480 to rotate the blocks 600, 602, the rods of the cam body are orbitally rotated about the central longitudinal axis X of the camming mechanism into engagement with the wafers. The orbiting of the rods causes the wafers W to reciprocate up and down between their raised and lowered positions as discussed previously. In the lowered position, the wafers W are engaged by adjacent rods 604, with a portion of the wafer being seated down between the adjacent between. The wafers W are then moved to their raised position as one of the rods 604 passes under the wafers. When the wafers W contact the gripping surfaces 505, the peripheral edges of the wafers are received by and held in the grooves 511 formed between adjacent O-rings in frictional engagement with the gripping surfaces, causing the wafers to roll on the rods 604 of the cam body 501 in a counter-rotating direction with respect to the rotating driven shaft 480 and cam body in the manner described previously. Thus, the rotating camming mechanism 462 imparts both an up and down reciprocating and rotating motion on the wafers W.

The wafer moving mechanism 26 of the present invention has been described as rotating and reciprocating semiconductor wafers W in a bath for cleaning semiconductor wafers. However, it is to be understood that the mechanism may alternatively be used to rotate and reciprocate wafers in another type of cleaning process, an etching process or other semiconductor wafer shaping process.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. Sonic wafer cleaning apparatus for cleaning semiconductor wafers, said apparatus comprising:

a tank for containing a liquid, the tank being sized and shaped for receiving at least a portion of a semiconductor wafer;

a sonic energy generator for imparting sonic energy to the liquid;

a wafer holder received within the tank for holding the semiconductor wafer with at least a portion of the semiconductor wafer immersed in the liquid in the tank; and a wafer-moving mechanism received within the tank for reciprocating and rotating the semiconductor wafer so that at least a portion of the wafer repeatedly passes through an upper surface of the liquid, said wafer-moving mechanism comprising a camming mechanism rotatably received in the tank and a drive for rotating the camming mechanism about a fixed central longitudinal axis of the camming mechanism to reciprocate and rotate the wafer, the camming mechanism including a cam body having opposing flats spaced apart on opposite sides of its longitudinal axis and opposing gripping surfaces extending between the flats, the cam body having a cross-section defining a major axis and a minor axis, the major axis of the cam body cross-section being greater than the minor axis, the gripping surfaces having a circumferentially extending groove for receiving a peripheral edge of the semiconductor wafer therein, the groove being sized for gripping the edge of the wafer as the camming mechanism rotates thereby to inhibit slippage of the wafer relative to the camming mechanism and to maintain uniform rotation and reciprocation of the wafer.

2. Apparatus as set forth in claim 1 wherein the gripping surfaces are generally arcuate.

3. Apparatus as set forth in claim 2 wherein the groove extends generally around the entire circumference of the cam body.

4. Apparatus as set forth in claim 2 wherein a portion of the groove has a width substantially smaller than the thickness of the wafer so that the wafer frictionally engages the gripping surface within the groove.

5. Apparatus as set forth in claim 2 wherein the gripping surfaces are defined by O-rings fitted tightly around the cam body and placed adjacent to one another in engaging relationship such that each adjacent pair of O-rings defines the groove of the gripping surfaces capable of receiving and gripping the wafer.

6. Apparatus as set forth in claim 1 wherein the cam body is of elastomeric material selected to facilitate frictional engagement between the cam body and the wafer.

7. Apparatus as set forth in claim 6 wherein the elastomeric material is polyurethane.

8. Apparatus as set forth in claim 6 wherein the elastomeric material of the cam body has a Shore A durometer hardness of less than or equal to about 75.

9. Apparatus as set forth in claim 8 wherein the elastomeric material of the cam body has a Shore A durometer hardness of about 50.

10. Apparatus as set forth in claim 6 wherein the camming mechanism further includes a shaft rotatable about the longitudinal axis of the camming mechanism, the cam body being mounted on the shaft for conjoint rotation therewith.

11. Apparatus as set forth in claim 6 wherein the cam body has an opening therein sized and shaped for reducing sonic energy absorption by the cam body.

12. Apparatus as set forth in claim 11 wherein the cam body has at least one cross-support extending across the opening for strengthening the cam body.

13. A camming mechanism for use in sonic semiconductor wafer cleaning apparatus of the type having a tank holding liquid and a wafer holder received in the tank for holding semiconductor wafers, the camming mechanism being constructed for mounting on the apparatus in the tank in a position for engaging the wafers, the camming mechanism being rotatable about a central longitudinal axis fixed relative to the tank for rotating and reciprocating the semiconductor wafers so that at least portions of the wafers repeatedly pass through an upper surface of the liquid in the tank, the camming mechanism comprising a cam body having opposing flats spaced apart on opposite sides of its longitudinal axis and opposing gripping surfaces extending between the flats, the cam body having a cross-section defining a major axis and a minor axis, the major axis of the cam body cross-section being greater than the minor axis, the gripping surfaces having a circumferentially extending groove for receiving a peripheral edge of the semiconductor wafer therein, the groove being sized for gripping the edge of the wafer as the camming mechanism rotates thereby to inhibit slippage of the wafer relative to the camming mechanism and to maintain uniform rotation and reciprocation of the wafer.

14. Apparatus as set forth in claim 13 wherein the gripping surfaces are generally arcuate.

15. Apparatus as set forth in claim 14 wherein the groove extends generally around the entire circumference of the cam body.

16. Apparatus as set forth in claim 14 wherein the smallest transverse dimension of the groove is less than the thickness of the wafer.

17. Apparatus as set forth in claim 13 wherein the cam body is of an elastomeric material selected to facilitate frictional engagement between the cam body and the wafer.

18. Apparatus as set forth in claim 17 wherein the elastomeric material of the body has a Shore A durometer hardness of less than or equal to about 75, and ideally about 50.

19. Apparatus as set forth in claim 17 wherein the camming mechanism further comprises a shaft rotatable about the longitudinal axis of the camming mechanism, the cam body being mounted on the shaft for conjoint rotation therewith.

20. Apparatus as set forth in claim 17 wherein the gripping surfaces of the cam body are defined by O-rings fitted tightly around the cam body and placed adjacent to one another in engaging relationship such that each adjacent pair of O-rings defines the groove capable of holding and gripping a wafer.

21. Sonic wafer cleaning apparatus for cleaning semiconductor wafers, said apparatus comprising:
   a tank for containing a liquid, the tank being sized and shaped for receiving at least a portion of a semiconductor wafer;
   a sonic energy generator for imparting sonic energy to the liquid;
   a wafer holder received within the tank for holding the semiconductor wafer with at least a portion of the semiconductor wafer immersed in the liquid in the tank; and
   a wafer-moving mechanism received within the tank for reciprocating and rotating the semiconductor wafer so that at least a portion of the wafer repeatedly passes through an upper surface of the liquid, said wafer-moving mechanism comprising a camming mechanism rotatably received in the tank and a drive for rotating the camming mechanism about a fixed central longitudinal axis of the camming mechanism to reciprocate and rotate the wafer, the camming mechanism including a cam body having a gripping surface extending substantially the length of the body, the gripping surface having grooves for receiving a peripheral edge of the semiconductor wafer therein, each groove being sized for gripping the edge of the wafer as the camming mechanism rotates thereby to inhibit slippage of the wafer relative to the camming mechanism and to maintain uniform rotation and reciprocation of the wafer.

22. Apparatus as set forth in claim 21 wherein the cam body comprises at least two spaced apart rods extending the length of the cam body in parallel, spaced relationship with the central longitudinal axis of the camming mechanism for orbital rotation about said longitudinal axis, each rod having one of said gripping surface extending substantially the length of the rod, said grooves extending circumferentially about each rod.

23. Apparatus as set forth in claim 22 wherein the gripping surfaces of the cam body are defined by O-rings fitted tightly around the rods and placed adjacent to one another in engaging relationship such that each adjacent pair of O-rings defines one of said grooves capable of holding and gripping a wafer.

* * * * *